// United States Patent [15] 3,667,010
Rindner et al. [45] May 30, 1972

[54] GUNN-TYPE SOLID-STATE DEVICES

[72] Inventors: Wilhelm Rindner, Lexington; Harold Roth, Needham, both of Mass.

[73] Assignee: The United States of America as represented by the Administrator of the National Aeronautics and Space Administration

[22] Filed: July 6, 1967

[21] Appl. No.: 651,627

[52] U.S. Cl ....................317/235R, 317/235 A, 317/234 J, 317/235 AJ, 331/107 G

[51] Int. Cl. ....................H01l 11/00

[58] Field of Search ....................317/234, 235; 331/107 G

[56] References Cited

UNITED STATES PATENTS

| | | | |
|---|---|---|---|
| 2,984,752 | 5/1961 | Giacoletto | 317/235 |
| 3,365,583 | 1/1968 | Gunn | 317/234 |
| 3,377,566 | 4/1968 | Lanza | 317/234 |
| 3,439,236 | 4/1969 | Blicher | 317/235 |

OTHER PUBLICATIONS

Electronics " Tuning Gunn?" Nov. 14, 1966, pages 48 & 50

*Primary Examiner*—Jerry D. Craig
*Attorney*—Garland T. McCoy, Herbert E. Farmer and John R. Manning

[57] ABSTRACT

This invention is a multi-terminal Gunn-type semiconductor microwave generator capable of producing signals of stable frequency over a frequency range. In one form, a group III–V semiconductor chip having a varying cross-sectional area is mounted between a pair of contacts. The inner portion of the chip is appropriately doped to create a region of one type of conductivity and an outer shell portion of the chip is appropriately doped to create a region of opposite or different conductivity with a junction formed therebetween. A potential is applied across the pair of contacts to create an electric field gradient along the current axis of the device. A bias is applied through a third contact to the junction, which for the sake of discussion will be referred to as a P/N junction. The biased P/N junction creates a space-charge region that controls the length of the active region, whence the third terminal controls the frequency of the signal generated by the overall device. Numerous alternative embodiments of the invention are possible within the general concept of creating a biased junction that controls the length of the electric field gradient between the first and second contacts.

4 Claims, 7 Drawing Figures

INVENTORS
Wilhelm Rindner &
Harold Roth

BY

ATTORNEYS

GUNN-TYPE SOLID-STATE DEVICES

BACKGROUND OF THE INVENTION

This invention relates generally to solid state electronic devices, and more particularly, to multi-terminal, junction-controlled, solid state, microwave generators.

One of the recently developed devices in the rapidly evolving semiconductor field is the Gunn-semiconductor device. This device is described in an article entitled "Instabilities of Current in III–V Semiconductors" by J. B. Gunn published in the *IBM Journal of Research and Development*, April 1964, pages 141 – 159.

Generally, the Gunn generator comprises a flat, rectangular or cylindrical chip of homogeneous semiconductor material. Usually, the semiconductor is a combination of elements from group III–V of the periodic table such as gallium arsenide or indium phosphide, for example. Contacts are applied to the two end faces of the chip.

In operation, a voltage is applied to the chip's contacts to create an electric field across the chip. When the electric field rises to a critical value known as the Gunn-threshold level FT, the device generates an output signal that has a stable frequency. That is, the applied voltage creates an electric field across the semiconductor chip and when this voltage level reaches a threshold or critical value, an output signal of a fixed frequency is generated. The voltage may rise above the threshold level, but the frequency remains constant. The actual frequency of the signal is determined by the distance between the contacts.

While the Gunn device, as described above and in the foregoing article, is a substantial step forward in the art because it is small, compact and reliable, it has certain limitations. For example, because this prior art device is limited to a specific frequency, determined by the distance between the contacts, it lacks versatility. That is, it can only operate at a particular frequency and not over a frequency range as is desirable in many environments. Further, because of the physical problems of creating a particular separation between the contacts, it is extremely difficult to create a device that operates at any specific predetermined frequency. Rather, a number of Gunn devices are fabricated and checked to determine their frequency of operation. Subsequently, those that operate at desired frequencies are chosen. This method of obtaining a Gunn device is undesirable because it increases the cost of the device.

Moreover, it is well known that a two-terminal device is less flexible than a multi-terminal device. That is, a two-terminal device generally operates in accordance with its built-in capabilities as determined by the signal applied to its two terminals and it is not subject to control from a separate control source. However, a multi-terminal device can be controlled by a separate source. Hence, a multi-terminal device has greater flexibility than a two-terminal device.

Therefore, it is an object of this invention to provide a new and improved Gunn-semiconductor device.

Therefore, it is an object of this invention to provide a new and improved Gunn-semiconductor device.

It is another object of this invention to provide a multi-terminal Gunn-type semiconductor signal generator.

It is also an object of this invention to provide a new and improved multi-terminal semiconductor device that generates stable signals over a frequency range.

It is a further object of this invention to provide a controllable semiconductor signal generator that is simple, compact and reliable.

SUMMARY OF THE INVENTION

In accordance with a principle of the invention, a multi-terminal Gunn-type semiconductor device is fabricated by forming a P/N or other junction in a conventional Gunn-type device. The junction lies in a shell having a longitudinal axis that is collinear with the current axis formed between the conventional contacts of a Gunn device. A third contact is made to the device so that the junction can be biased. When the junction is biased, a space-charge region is created which controls the electric field gradient along the current axis of the device; that is, it controls the length of the electric field gradient that is above the Gunn threshold level. In accordance with general Gunn theory, control of the length above the threshold level controls the frequency of the signal generated by the device. And, in accordance with the invention, this length can be varied by varying the bias on the junction to result in a variation of the generated signal frequency. Hence, the device is useful, inter alia, as an oscillator, a modulator, an amplifier, or a switch.

In accordance with a further principle of the invention, the shell is in the form of a truncated-cone or in the form of a cylinder.

In accordance with a still further principle of the invention, the shell may exist along the entire current axis of the device or along only a portion of it. And, a forward as well as a reverse bias can be used to control the device.

In accordance with a still further principle of the invention, the device can have a planar form such as by thin film deposition and the controlling junction can lie entirely on one face of the device. Realization of such a configuration may be obtained by conventional epitaxial and vapor deposition techniques.

BRIEF DESCRIPTION OF THE DRAWINGS

The foregoing objects and many of the attendant advantages of this invention will become more readily appreciated as the same becomes better understood by reference to the following detailed description when taken in conjunction with the accompanying drawings wherein.

DESCRIPTION OF THE PREFERRED EMBODIMENTS

To fully understand the invention, it is desirable to consider first the usual structure of prior art Gunn devices. These are formed of flat, rectangular, circular (or of other geometric configuration) chips of group III–V semiconductor compounds such as gallium arsenide or indium phosphide, for example. A pair of contacts is attached to the end surfaces and the chip has both uniform cross-sectional area and uniform doping; for example, the chip may be doped with tellurium to give it N-type properties.

For operation, the device requires that a minimum threshold electric field be created along the current axis of the device. This electric field is created by applying an electric potential across the contacts. When the electric field goes above the threshold level, the device generates a stable microwave signal at a frequency determined by the distance between the two contacts.

This invention improves upon the prior art devices by creating a device for controlling the length of the electric field gradient existing along the current axis that is above the threshold level necessary to create different stable frequency signals. FIGS. 1 – 5 illustrate various embodiments of the invention made in accordance with the general concept of the invention. It should be noted that these figures are distorted to better illustrate the inventive concept.

Figure 1:
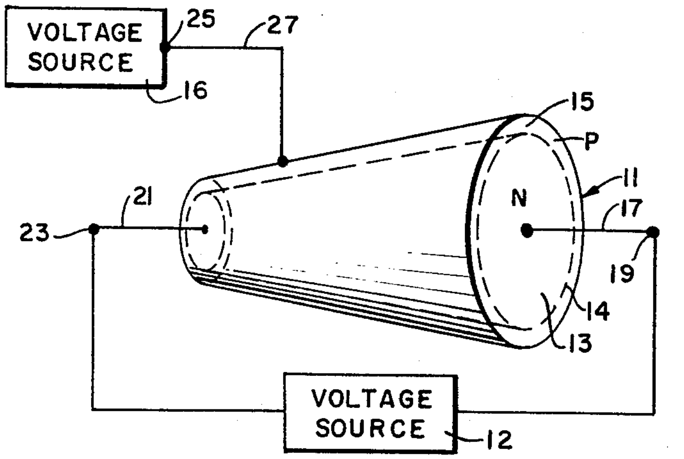
FIGS. 1 and 2 illustrate alternative embodiments of the invention which utilize the geometrical constriction of the current path by biasing a junction which is in the form of a truncated cone.

FIG. 1 comprises a chip 11 of a Gunn-type semiconductor material such as gallium arsenide or indium phosphide, for example. The chip is in the shape of a truncated cone and has an inner region 13 also in the form of a truncated cone that is appropriately doped to give it one type of semiconductive property — N-type, for example. One suitable dopant is tellurium, for example. The chip also has an outer region or shell 15 in the form of a truncated cone that is appropriately doped to make it a region of opposite conductivity type. It is understood that the outer and inner shells can be of the same conductivity types but having different conductivity levels. As illustrated in FIG. 1, the junction between the P and N regions form a P/N junction 14 that is also in the form of a truncated cone.

The center of the inner or N region 13 of the larger of the surfaces of the truncated cone is illustrated as connected by a first conductor 17 to a first terminal 19. And, the center of the inner region of the opposite surface is similarly connected by a second conductor 21 to a second terminal 23. In addition, a third terminal 25 is connected by a third conductor 27 to the outer or P region 15 of the device. Any suitable P-type dopant material may be used, as for example, zinc and other dopants of the type described in "Part II-Technology of Transistors, Diodes and Photocells," beginning on page 6–2, in the *Handbook of Semiconductor Electronics*, 2nd edition, by L. P. Hunter, McGraw-Hill, New York, 1962.

Hence, the device is in the form of a truncated cone with first and second terminals connected to the center of both ends of the cone. A shell of P material, also in the form of a truncated cone, cone, surrounds an inner N-region and a P/N junction 14 is formed. This P/N junction 14 is also in the form of a truncated cone. The longitudinal axis of all three regions, the P region, the N region, and the P/N junction region are illustrated as collinear, although this is not a requirement. Further, this longitudinal axis is the current axis of the device that passes through the pair of contacts connected to the first and second terminals 19 and 23.

In operation, a voltage from voltage source 12 is applied to the first and second terminals 19 and 23 and creates an electric field gradient along the current axis of the device between the two end surfaces of the chip 11. It is to be noted that either end surface of the chip 11 may be the cathode or anode as the device is a bilateral device. However, in the truncated cone embodiment better results in terms of wave coherence have been observed when the cathode is at the smaller end surface. In accordance with conventional Gunn theory, the device generates an output electrical signal across the same terminals 19 and 23 having a stable frequency related to the length of the electric field gradient that is above the threshold level. A potential from a voltage source 16 is applied to the third terminal 25 to bias the P/N junction 14. It is this forward or reverse bias that controls the length of the electric field gradient that is above the threshold level.

For example, if potential is applied to the third terminal 25 that is negative with respect to the potential applied to the other terminals, the P/N junction is reverse biased. This reverse bias creates a constricting space-charge region in the device. This space-charge region constricts the current flow by varying the cross-sectional current density of the device along its current axis. Hence, the constriction caused by the space-charge controls the length of the electric field gradient that is above the threshold level. And, as the reverse bias increases, the length of the electric field gradient above the threshold level increases and, therefore, the frequency decreases. Thus, the frequency of the device can be controlled by controlling the voltage of the bias signal 16 applied to the third terminal. Because of the truncated cone shape of FIG. 1, the increase in the length of the effective electric field will proceed from the small end to the large end.

To more fully explain the operation of the invention, assume that the voltage applied between the first and second terminals 19 and 23 is insufficient to create an electric field gradient above the threshold level along any portion of the current axis when no reverse bias is applied to the P/N junction 14. Now, when a reverse bias voltage is applied to the third terminal 25, it raises a portion of electric field gradient above the threshold level. Hence, if the reverse bias voltage is switched from zero to a set level, the device performs as a switch that is switched on or off. Alternatively, the reverse bias potential can vary so that the portion of the electric field gradient along the current axis of the device that is above the Gunn-threshold level varies to form a modulator, amplifier, or voltage-controlled oscillator. While this example assume that the voltage applied to the first and second terminals was insufficient to create an electric field above the threshold level for any portion of the length of the current axis, it will be appreciated that the device will work equally as well by starting with a portion of the current axis above the threshold level. The reverse biased P/N junction would then merely change the length of the electric field gradient above the threshold level to change the generated frequency.

Figure 2:
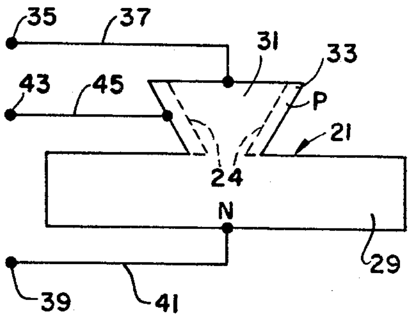

FIG. 2 illustrates an embodiment of the invention in mesa form 21. The embodiment illustrated in FIG. 2 includes a base 29 formed of a semiconductor material of one type of conductivity — N-type, for example. An inverted truncated-cone section 31 having a similar type of conductivity projects away from the base 29. A region of opposite conductivity 33 exists in a shell around the exterior of the truncated cone in a manner similar to the embodiment illustrated in FIG. 1. Hence, a truncated cone region with a truncated cone shaped P/N junction 24 is formed. A first terminal 35 is connected by a conductor 37 to the center of the open end of the truncated cone 31. A second contact 39 is connected by a conductor 41 to the base 29 at a point that is axially aligned with the longitudinal axis of the truncated cone. And, a third contact 43 is connected by a conductor 45 to the P region.

The embodiment illustrated in FIG. 2 operates similarly to the embodiment illustrated in FIG. 1. That is, a voltage from a power supply (not shown) is applied to the first and second terminals 35 and 39 to create an electric field gradient along the axis of the truncated cone to the base region 29. And, the P/N junction is biased from a voltage supply (not shown) through the third terminal 43 so that the length of the electric field gradient above the Gunn-threshold level can be controlled. This control can provide a switching, amplifying, oscillating or modulating effect as hereinabove described. When the threshold level is reached or exceeded, the output signal appears across the terminals 35 and 39.

The mesa configuration of the device illustrated in FIG. 2 could be easily formed by exploiting the phenomenon of undercutting that occurs when a mesa is etched out. After the etching step is completed, the P region is formed by diffusing a suitable dopent into the N region in the desired areas. Contacts are then added to form the illustrated structure. Obviously, the shape of the samples determines the switching or frequency dependence on bias; hence, it is possible to obtain a wide range of bias-frequency relationships to fit special requirements.

Figure 3:
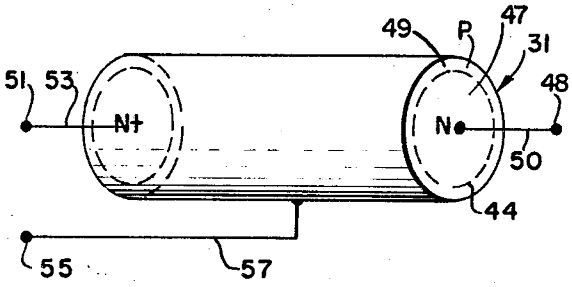
FIG. 3 is an illustration of an alternative embodiment which utilizes carrier injection into or extraction of mobile charges out of the current path by biasing the junction formed between a uniformly doped region and a non-uniformly doped region.
Figure 3A:
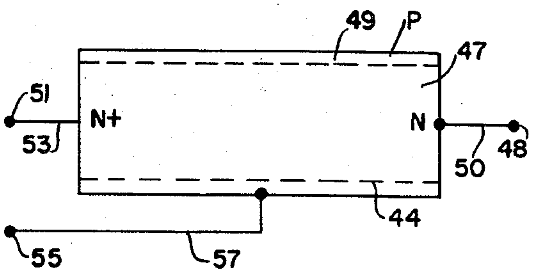
FIG. 3*a* is a sectional view of the device of the FIG. 3 taken along its principal axis.

FIG. 3 and FIG. 3*a* illustrate a still further embodiment of the invention in the form of a cylinder 31 having a cylindrical-inner N region 47 and a cylindrical-outer P region 49 with a cylindrical P/N junction 44 formed between the two regions. To obtain the truncated cone effect of FIG. 1, the doping or restrictivity of the N region varies from one end to the other. That is, to create a device wherein the electric field gradient can be controlled, either a varying cross-sectional area between the first and second terminals or a varying doping between the terminals must be created. In FIG. 3, the variation in doping is created and is illustrated by the N+ at one end of the cylinder's N region and the N at the other end of the region. As with FIGS. 1 and 2, a first terminal 48 is connected by a conductor 50 to one end of the N region 47 of cylinder and, a second terminal 51 is connected by a conductor 53 to the opposite parallel end of the N region. In addition, a third terminal 55 is connected by a conductor 57 to the P region.

The operation of FIG. 3 is identical to the operations of FIGS. 1 and 2, hence, it will not be discussed. However, it should be noted that when a reverse bias is applied to the P/N junction, the space charge layer created by this reverse bias penetrates deepest into the core where the N doping is weakest and least where the doping is highest. Hence, the variation in doping of the FIG. 3 embodiment achieves the same result as the geometrical shaping of the FIG. 1 and 2 embodiments.

Figure 4:
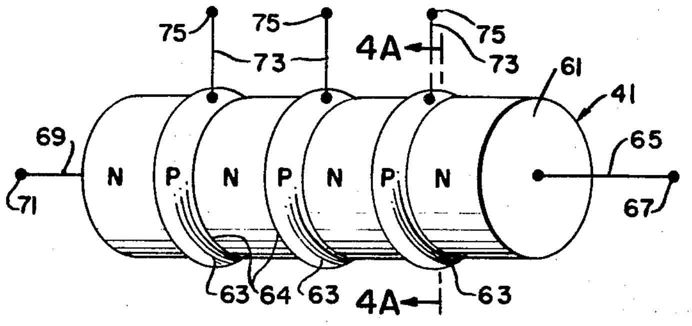
FIG. 4 illustrates an alternative embodiment utilizing a plurality of junctions which are individually biased.
Figure 4A:
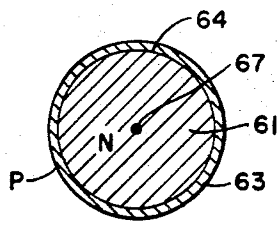
FIG. 4*a* is a sectional view taken along the line 4*a*–4*a* of the FIG. 4.

FIG. 4 and FIG. 4a illustrate a further alternative embodiment of the invention that comprises a cylinder 41 of N-type semiconductive material 61 having a plurality of ring-shaped bands 63 of P-type material formed around the cylinder to create ring-shaped P/N junctions 64. One end of the cylinder 61 is connected by a conductor 65 to a first terminal 67 and the other end of the cylinder is connected by a conductor 69 to a second terminals 71. Each ring-shaped P region 63 is connected by a conductor 73 to a terminal 75.

In the FIG. 4 embodiment, the length of the current axis that has an electric field gradient above the threshold level is controlled by a plurality of space charge regions as opposed to the single space charge region of the previously described embodiments of the invention. The plurality of P/N junctions and their resultant space charge regions control the length of the electric field gradient above the threshold level in the same manner as a device having a single P/N junction and being either geometrically varied or doped between the end surfaces. More specifically, when a bias is applied to any one of the P/N junctions 64 of the embodiment illustrated in FIG. 4, only a short section of the electric field gradient along the current axis is above the threshold level. When two junctions are biased, a longer section of the electric field gradient is above the threshold level. And, if all three P/N junctions are biased, then the full length of the electric field gradient is above the threshold level. Hence, at least three different frequencies can be generated across terminals 67 and 71 for the illustrative embodiment of FIG. 4. Other frequencies can be generated by combining various combinations of biased junctions. The space charge region created by biasing either one, two or three of the junctions determines the exact frequency. Hence, the device could be used to switch from a first to a second to a third frequency, for example, and, therefore, represents an embodiment of the device functioning as an analog to digital converter.

It should be noted, that FIG. 4 is merely by way of example; that is, FIG. 4 illustrates three P bands surrounding the N region, however, two, one or more than three bands could be used. The number of bands would be dependent upon the particular analog to digital requirement.

Figure 5:
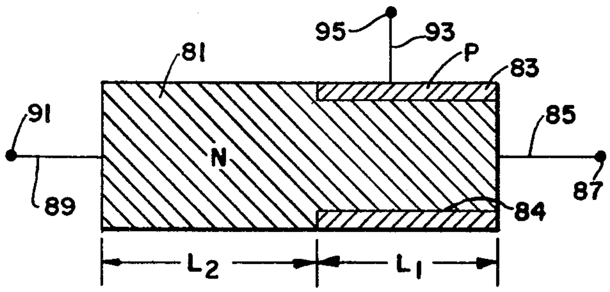
FIG. 5 is a sectional view of an alternative embodiment utilizing the biasing of a junction occupying only part of the total length of the device.

FIG. 5 illustrates still another alternative embodiment of the invention and comprises an inner cylindrical-shaped N region 81 surrounded by an outer cylindrical-shaped P region 83 along a portion of the N region's length. That is, the P region is in the form of a cylinder surrounding a portion of the length of the N region's cylinder to create a cylindrical P/N junction 84 along only a portion of the overall length. One end of the N region's cylinder is connected by a conductor 85 to a first terminal 87 and the other end of the N region's cylinder is connected by a conductor 89 to a second terminal 91. And, the P region 83 is connected by a conductor 93 to a third terminal 95.

In general, the embodiment of the invention illustrated in FIG. 5 operates as one section of the embodiment of the invention illustrated in FIG. 4. That is, when a voltage from a voltage source (not shown) is applied to the first and second terminals 87 and 91, an electric field gradient exists along the current axis of the device. By reverse biasing the P/N junction, this electric field gradient can be raised above the threshold level to generate a signal across terminals 87 and 91 at a stable frequency. This frequency is determined by the length $L_1$ of the chip covered by the P region. That is, since the P region only covers a portion of the cylindrical length, a constricting space charge region can only exist for that portion. Consequently, the length $L_1$ of the P region determines the frequency of the resulting signal.

In addition to reverse biasing the P/N junction of the embodiment of the invention illustrated in FIG. 5, the P/N junction can also be forward biased. When the junction is forward biased, a signal of a different frequency is generated. That is, in FIG. 5 the frequency of the signal that is generated when the device is reverse biased is determined by the length $L_1$ of the region covered by the P material. However, if the P/N junction is forward biased, the device illustrated in FIG. 5 will generate a signal having a frequency determined by the length $L_2$ of the cylinder not covered by the P region. More specifically, if the potential applied to the first and second terminals 87 and 91 is insufficient to generate a stable signal, then at least three conditions can occur. These conditions are: off, because no potential is applied to the third terminal; on, with a frequency determined by $L_1$, because the P/N junction is reverse biased; and on, with a frequency determined by $L_2$, because the P/N junction is forward biased.

It will be appreciated by those skilled in the art and others, that the forward biasing of the P/N junction as specifically described with respect to FIG. 5 is equally suitable for the embodiments of the invention illustrated in FIGS. 1 through 4. If the P/N junction is forward biased rather than reverse biased, the constrictive effect does not occur, rather the opposite effect occurs. Hence, the embodiments of the invention illustrated and discussed above can be operated either reverse or forward biased as desired for a particular environment. However, it will be appreciated that in certain embodiments such as those illustrated in FIGS. 1 through 3, the forward bias condition only operates when the potential applied to the first and second terminals is above the threshold level. That is, the potential must create a condition wherein a portion of the length of the electric field gradient is above the threshold level because the forward bias situation reduces the amount of the electric potential gradient above the threshold level whereas the reverse biased P/N junction increases the length of the electric field gradient above the threshold level.

It will also be appreciated by those skilled in the art and others, that the embodiments of the invention illustrated in the figures and herein are only by way of example. These embodiments are illustrated by cylindrical and cone-shaped; however, other types of Gunn configurations such as rectangular, or, generally, a configuration without any axis of symmetry can be used. Further, FIGS. 1, 2, 4 and 5 illustrate homogeneous N and P region materials while FIG. 3 illustrates a variable N region. These two combinations can be combined. That is, the variable doping to create a variable gradient can be combined with the various configurations illustrated in the cylindrical and truncated cone configurations of FIGS. 1, 2, 4 and 5 to enhance those configurations. In fact, it should be noted that a bias-dependent non-uniformity in the cross-section of the current path will always occur with symmetrical construction and reverse bias, simply because the potential drop along the current axis yields a non-uniform expansion of the space charge. And, in some embodiments, this effect alone may result in adequate frequency control without the use of geometry or doping variations. It should be emphasized that all junctions referred to may be junctions of any type containing a plane of transition in doping type or level or may be a barrier junction formed by a metal-semiconductor or semiconductor-semiconductor interface. Furthermore, the control exercised by junctions may be supplemented or substituted by the generation of carriers when electromagnetic radiation of suitable wavelength is directed on a surface of the device. Hence, the invention can be practiced otherwise than as specifically described herein.

What is claimed is:

1. A semiconductor device for generating a plurality of frequencies comprising:

a chip of semiconductor material formed of group III–V elements having opposed surfaces and a current axis therebetween, said material having an inner region of one conductivity and an outer region of different conductivity with a junction formed therebetween;

said inner region, said outer region, and said junction all forming cylinders and disposed with respect to said current axis;

wherein one of said regions includes variable doping to cause a resistivity gradient from one surface to the opposing surface of said region;

means connected to said opposed surfaces for applying a potential to one of said regions to create an electric field gradient along said current axis; and further means connected to the other of said regions for biasing said junction to control the length of said electric field gradient.

2. The device as defined in claim 1 wherein said semiconductor material is gallium arsenide.

3. The device as defined in claim 1 wherein said semiconductor material is indium phosphide.

4. An analog to digital converter comprising a chip of semiconductor material formed of group III–V elements having opposed surfaces and a current axis therebetween, said chip being of one conductivity type and which includes variable doping to cause a resistivity gradient from one surface to the opposing surface, a plurality of annular regions of different conductivity type formed about said chip, each of said regions forming a junction with said chip, means coupled to said opposed surfaces for applying a potential to said chip to create an electric field gradient along said current axis, and means for applying potentials to said regions for controlling the length of the electric field gradient.

* * * * *